(12) United States Patent
Hotta et al.

(10) Patent No.: US 8,829,669 B2
(45) Date of Patent: Sep. 9, 2014

(54) SEMICONDUCTOR DEVICE

(75) Inventors: Yutaka Hotta, Chiryu (JP); Tatsuyuki Uechi, Toyoake (JP)

(73) Assignees: Aisin Aw Co., Ltd., Anjo (JP); Toyota Jidosha Kabushiki Kaisha, Toyota (JP)

( * ) Notice: Subject to any disclaimer, the term of this patent is extended or adjusted under 35 U.S.C. 154(b) by 0 days.

(21) Appl. No.: 13/994,763

(22) PCT Filed: Dec. 21, 2011

(86) PCT No.: PCT/JP2011/079639
§ 371 (c)(1),
(2), (4) Date: Jun. 17, 2013

(87) PCT Pub. No.: WO2012/096112
PCT Pub. Date: Jul. 19, 2012

(65) Prior Publication Data
US 2013/0277820 A1 Oct. 24, 2013

(30) Foreign Application Priority Data

Jan. 13, 2011 (JP) ................................. 2011-004779

(51) Int. Cl.
H01L 23/34 (2006.01)
H01L 23/40 (2006.01)
H01L 23/473 (2006.01)
H05K 7/20 (2006.01)

(52) U.S. Cl.
CPC ............ *H01L 23/34* (2013.01); *H01L 23/4006* (2013.01); *H01L 23/473* (2013.01); *H05K 7/20927* (2013.01)
USPC ........... 257/712; 257/714; 257/715; 257/718; 257/735

(58) Field of Classification Search
None
See application file for complete search history.

(56) References Cited

U.S. PATENT DOCUMENTS

2002/0027645 A1 * 3/2002 Shiraishi ......................... 355/30

FOREIGN PATENT DOCUMENTS

JP    A-2003-199363    7/2003

* cited by examiner

Primary Examiner — Kyoung Lee
(74) Attorney, Agent, or Firm — Oliff PLC

(57) ABSTRACT

A semiconductor device configured to enable efficient cooling of an element and downsizing of the device. The semiconductor device including an element unit connected to a surface of a cooler. A support member that has a condenser housing chamber that houses the condenser. The condenser has two parallel planar surfaces that are parallel with each other. The condenser housing chamber has a parallel opposing surface that is arranged in parallel with the element unit arrangement surface and faces the element unit arrangement surface, and houses the condenser in a state where the two parallel planar surfaces are arranged in parallel with the parallel opposing surface. The support member is fixed to the cooler in a state where the parallel opposing surface presses the element unit toward the cooler.

8 Claims, 4 Drawing Sheets

SEMICONDUCTOR DEVICE

TECHNICAL FIELD

The present invention relates to a semiconductor device including a element unit having a semiconductor element, a condenser electrically connected to the element unit, a control board controlling the semiconductor element, and a cooler that has an element unit arrangement surface arranged so that the element unit is mounted on the element unit arrangement surface, and cools the element unit arranged on the element unit arrangement surface.

BACKGROUND ART

As the semiconductor device described above, a device described, for example, Patent Document 1 is already known. In the following description of the background art, reference numerals or names used in Patent Document 1 are stated and cited in parentheses where appropriate. In the device described in Patent Document 1, a first base (a case frame 20) to which element units (switching element power modules Ug and Um) are fixed, a second base (a bracket 23) to which a condenser (a smoothing condenser C) is fixed, and a third base (a bracket 24) to which a control board (Uc) is fixed, are arranged so as to be sequentially stacked in a height direction as shown in FIG. 1 of the Document, thereby reducing a size of the device.

The device described in Patent Document 1 has a configuration in which the element units are cooled by arranging the element units so that the element units abut on a bottom wall of the first base (a heat sink H), as described in the paragraph 0042 of the Document. In order to cool the element units efficiently, a configuration is adopted in which the element units are directly fixed to the bottom wall, as described in the paragraph 0034 in the Document, so that the element units come into close contact with the bottom wall of the first base.

However, in Patent Document 1, there is no specific description regarding how to fix the element units to the first base. Therefore, with the configuration of Patent Document 1, depending on a fixation structure of the element units, it is possible to cool the element units efficiently but the size of the device is likely to increase.

RELATED-ART DOCUMENTS

Patent Documents

[Patent Document 1] Japanese Patent Application Publication No. 2003-199363 (JP 2003-199363 A) (paragraphs 0034, 0042, FIG. 1, and so on)

SUMMARY OF THE INVENTION

Thus, it is desired to realize a semiconductor device that enables both efficient cooling of an element unit and downsizing of the device.

A characteristic configuration of a semiconductor device according to the present invention, which has an element unit having a semiconductor element, a condenser electrically connected to the element unit, a control board that controls the semiconductor element, and a cooler that has an element unit arrangement surface arranged such that the element unit is mounted on the element unit arrangement surface, and cools the element unit arranged on the element unit arrangement surface, includes a support member that has a condenser housing chamber that houses the condenser, and a board fixing portion that is across the condenser housing chamber from the cooler and has the control board fixed to the board fixing portion. The condenser has two parallel planar surfaces that are parallel with each other, the condenser housing chamber has a parallel opposing surface that is arranged in parallel with the element unit arrangement surface and faces the element unit arrangement surface, and houses the condenser in a state where the two parallel planar surfaces are arranged in parallel with the parallel opposing surface, and the support member is fixed to the cooler in a state where the parallel opposing surface presses the element unit toward the cooler.

In the present application, "opposing" with respect to the two surfaces means that these two surfaces are arranged in directions so that the two surfaces face each other, when only an arrangement of (normal directions to) the two surfaces is focused on regardless of whether there is any member therebetween.

According to the above characteristic configuration, because the support member is fixed to the cooler in the state where the parallel opposing surface presses the element unit toward the cooler, it is possible to simplify a configuration for arranging the element unit on the element unit arrangement surface provided in the cooler. This makes it possible to reduce the number of parts and simplify an assembly process. Moreover, a distance between the parallel opposing surface and the element unit is able to be reduced to be short, and a dimension of the device in a height direction orthogonal to the element unit arrangement surface is able to be reduced to be small.

At this time, because the element unit is pressed toward the cooler, when the element unit is arranged so as to be in contact with the element unit arrangement surface, a good surface contact is realized at a contact position between the element unit and the element unit arrangement surface. Also, in a case where another member such as a thermally conductive member is arranged between the element unit and the element unit arrangement surface, good surface contact is also realized at a contact position between the element unit and the another member and at a contact position between the another member and the element unit arrangement surface.

Therefore, when the element unit is cooled by thermal conduction via the above-described contact positions, thermal conduction between the element unit and the cooler is ensured well, and the element unit is thus cooled efficiently. Also, in a case where a coolant flows between the element unit and the cooler, hermeticity of a coolant flow path provided between the element unit and the cooler is well ensured, thereby efficiently cooling the element unit.

As described above, according to the above characteristic configuration, a dimension of the device in the height direction is reduced to be low, and downsizing of the device is thus achieved, and, at the same time, the element unit is cooled efficiently.

In addition, according to the above characteristic configuration, because the support member that supports both the condenser and the control board is fixed to the cooler, it is possible to cool the condenser and the control board actively by using thermal conduction via the support member.

Here, it is preferred that a connection terminal of the element unit to be connected with the condenser is arranged so as to project from a body portion of the element unit in a predetermined projection direction parallel with the element unit arrangement surface, the condenser housing chamber has an opening portion that is open towards the projection direction, and the condenser is housed in the condenser housing chamber together with a filled resin.

In the present application, "open towards a certain direction" is used as a concept that, where the direction is used as a reference direction, a shape of the opening portion is not limited to a shape in which an opening direction of the opening portion is parallel with the reference direction, and includes a shape in which an intersection angle between the opening direction and the reference direction is within a predetermined range (for example, less than 45°) even if the opening direction is a direction intersecting with the reference direction. Here, the opening direction is defined as an average value of normal directions to (an average direction of) respective spots in an opening surface, in other words, a sum of normal vectors at the respective spots in the opening surface. For example, when the opening surface is a single planar surface, a normal direction to the planar surface is the opening direction. When the opening surface is formed by a combination of two planar surfaces having different normal directions, an average value of the two normal directions (a sum of the two normal vectors) is the opening direction. When the opening surface is an arc-like surface, a normal direction to a center point of the arc-like surface is the opening direction.

According to the configuration, because the connection terminal of the element unit to be connected with the condenser, and an electrode terminal projecting towards the opening direction of the condenser are able to be projected in the same direction, it is possible to reduce a distance therebetween, and a length of a connection member that electrically connects the condenser and the element unit is able to be reduced to be short. Therefore, when the element unit has the switching element serving as a semiconductor element, it is possible that a surge voltage generated by switching of the switching element is reduced to be small, and stability of the semiconductor device is easily ensured even if an element with high withstand voltage performance is not used, or a protection circuit (a snubber circuit, and the like) is not provided. Further, because a shape of the connection member is easily simplified, it is possible to simplify a manufacturing process by cutting a step of bending the connection member.

Also, according to the above-described configuration, because the condenser is housed together with the filled resin in the condenser housing chamber, deterioration of the condenser due to moisture that enters from outside is prevented. At this time, as the opening portion of the condenser housing chamber is formed to open towards the projection direction that is a direction parallel with the element unit arrangement surface, it is possible to use a direction orthogonal to a height direction as a direction in which the filled resin needs to be ensured to have a predetermined thickness or larger, in order to prevent moisture from entering from outside. Thus, it is possible to prevent deterioration of the condenser while reducing a dimension of the device in the height direction to be small.

As described above, in the configuration where the condenser housing chamber has the opening portion that opens toward the projection direction, it is preferred that the semiconductor device includes a plurality of the element units, the condenser housing chamber is formed into an oblong shape in a planar view when viewed in a direction orthogonal to the parallel opposing surface, and is arranged so that a long side of the condenser housing chamber is orthogonal to an opening direction of the opening portion in the planar view, and each of the plurality of element units is arranged so as to have a portion that overlaps the parallel opposing surface when viewed in a direction orthogonal to the element unit arrangement surface.

In the present application, with respect to an arrangement of two members, "having an overlapping portion when viewed in a certain direction" means that, when the direction is expressed as a line-of-sight direction and a viewpoint is moved to respective directions orthogonal to the line-of-sight direction, there is a viewpoint at least in a part of a region at which the two members look overlapping each other.

According to this configuration, because the single parallel opposing surface is able to press the plurality of element units toward the cooler, the above-described effects are obtained in each of the plurality of the element units even when there are the plurality of element units provided.

At this time, because the condenser housing chamber is formed into an oblong shape in a planar view, arrangement regions for the element units, where the element units are arranged so as to have portions overlapping the parallel opposing surface, are made into oblong-shaped regions in the planar view. Therefore, it is possible to arrange the element units efficiently even in a case where the element units are formed into rectangular shapes in the planar view.

As described above, in the configuration where the condenser housing chamber is formed into an oblong shape in the planar view, and the plurality of element units are arranged so as to have portions overlapping the parallel opposing surface when viewed in the direction orthogonal to the element unit arrangement surface, it is preferred that the plurality of element units have the same projection direction and are arranged side-by-side in a direction orthogonal to the projection direction when viewed in the direction orthogonal to the element unit arrangement surface, and the opening direction of the opening portion is a direction same as the projection direction.

According to this configuration, the plurality of element units are arranged in an arrangement region having an oblong shape that is long in the direction orthogonal to the projection direction in the planar view. In this case, in a state where a side portion corresponding to the opening portion in the condenser housing chamber formed into an oblong shape in the planar view, and a side portion on the side in the projection direction of the element unit arrangement region having an oblong shape are located on the same side, it is possible to overlap the condenser housing chamber and the element unit arrangement region on the same side with respect to these side portions. Therefore, it is possible to easily increase an overlapping ratio between the plurality of element units and the condenser housing chamber in the planar view, and a dimension of the device in the direction orthogonal to the height direction is able to be decreased.

Further, because the plurality of element units share the same projection direction, it is possible to carry out a connection work between the element units and the condenser from the same direction, thereby simplifying a manufacturing process.

In the semiconductor device having each of the configurations stated above, it is preferred that a surface of the element unit that faces the element unit arrangement surface is a heat transfer surface through which heat from the semiconductor element is transferred, and a flow path for a coolant that cools the element unit is formed between the heat transfer surface and the element unit arrangement surface.

According to this configuration, due to the coolant flowing through the flow path, the element units are able to be cooled efficiently. At this time, because the element units are pressed toward the cooler, hermeticity of the flow path is ensured well, thus preventing the coolant from leaking out from the flow path.

MODES FOR CARRYING OUT THE INVENTION

Figure 1:
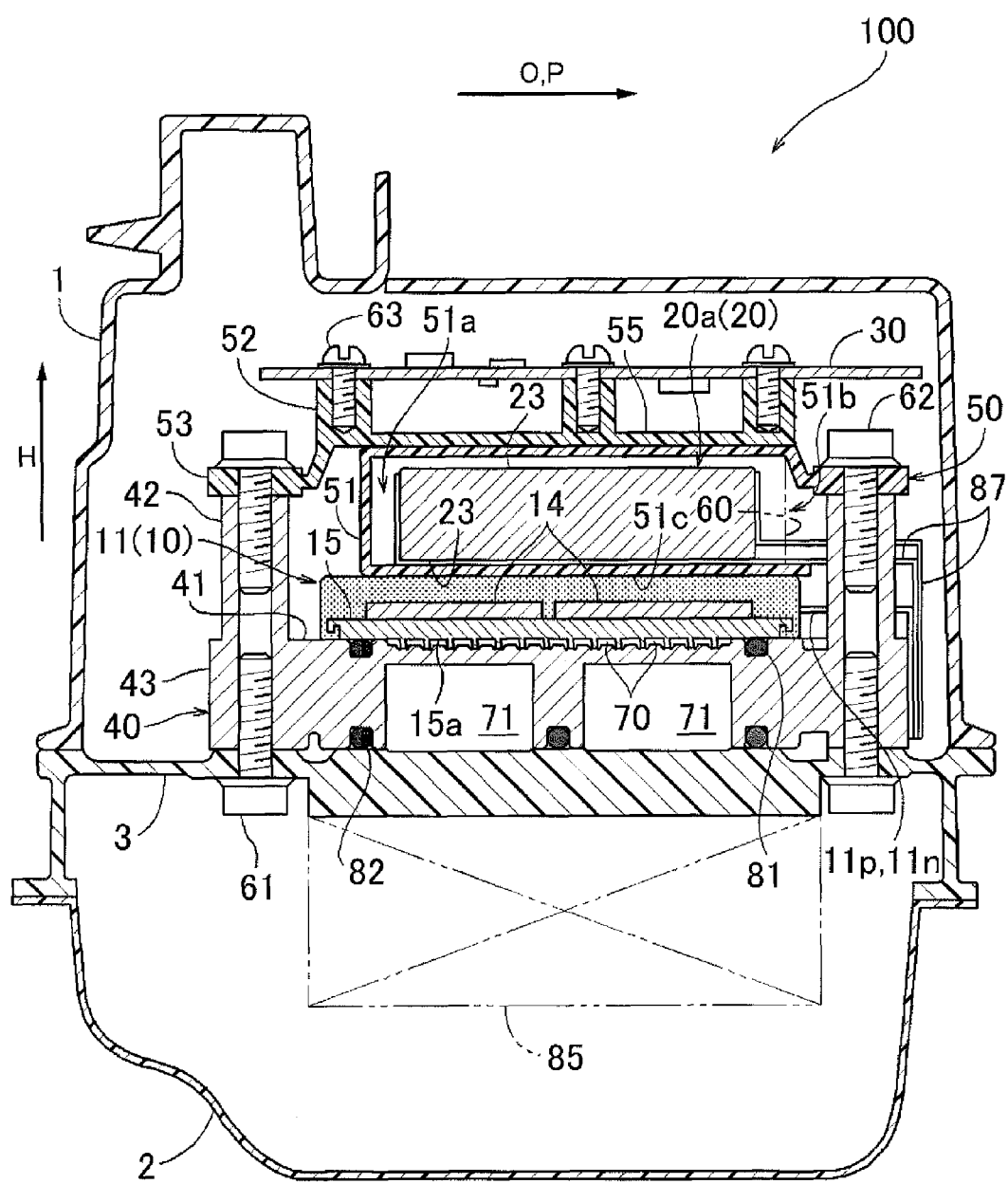
FIG. 1 is a sectional view of an inverter device according to an embodiment of the present invention.

An embodiment of a semiconductor device according to the present invention will be described with reference to the drawings. The description will be predetermined using a case as an example where the semiconductor device according to the present invention is applied to an inverter device that controls rotary electric machines. As shown in FIG. 1, an inverter device 100 according to the present embodiment includes a cooler 40, switching units 10 serving as element units, condensers 20, and a control board 30. In such a configuration, the inverter device 100 according to the present embodiment has a characteristic in that the inverter device 100 includes a support bracket 50 that houses the condensers 20 and serves as a support member supporting the control board 30, and that the support bracket 50 is fixed to the cooler 40 in a state where the support bracket 50 presses the switching units 10 toward the cooler 40. Accordingly, efficient cooling of the switching units 10, and size reduction of the inverter device 100 in a height direction H are both enabled. The configuration of the inverter device 100 according to the present embodiment will be described below in the order of "Overall configuration of the inverter device", "Configurations of the switching units", "Configuration of the cooler" and "Configuration of the support bracket".

In the following explanation, a direction orthogonal to an element unit arrangement surface (hereinafter, simply referred to as an "arrangement surface") 41 provided in the cooler 40 will be defined as the height direction H. The height direction H is a vertical direction when the arrangement surface 41 is in parallel with a horizontal surface. In addition, "up" refers to a direction (upper side in FIG. 1) toward the switching units 10 from the arrangement surface 41 along the height direction H, "low" refers to a direction (lower side in FIG. 1) towards an opposite side of the switching units 10 (toward a base member 3) from the arrangement surface 41 along the height direction H. Also, in the following explanation, directions of members that form the inverter device 100 represent directions of these members in a state where the members are assembled to the inverter device 100, unless otherwise specified.

In the present application, "parallel" and "orthogonal" are used not only to include the case of perfect parallelism and orthogonality, but also to include variations according to errors in manufacturing. Errors in manufacturing occur due to, for example, variations of dimensions and attaching positions within tolerance limits. Further, in the present application, the "rotary electric machine" is used to include any of a motor (an electric motor), a generator (an electric generator), and a motor generator having functions of both a motor and a generator where necessary.

1. Overall Configuration of the Inverter Device

Figure 2:
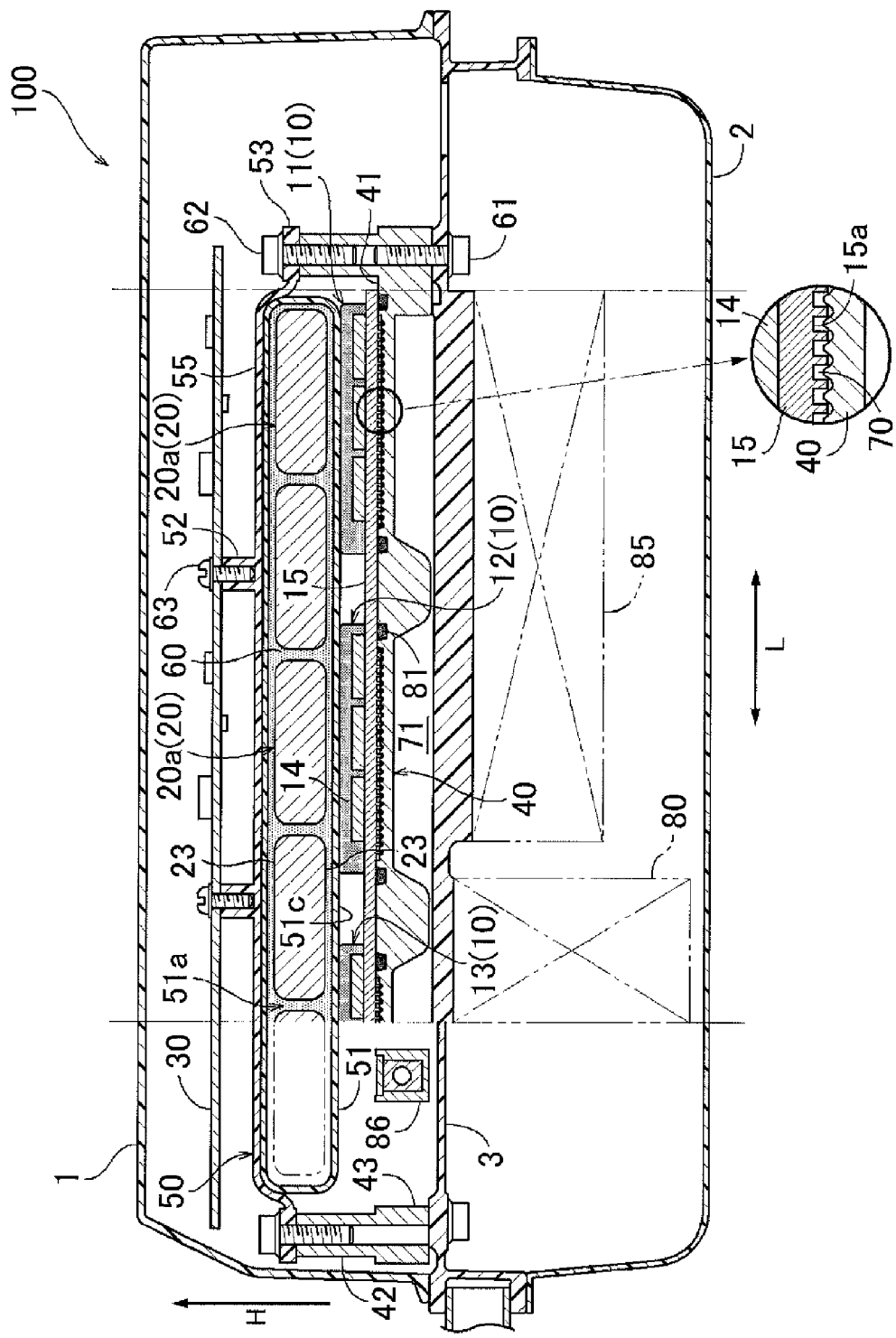
FIG. 2 is a sectional view of the inverter device in another direction according to the embodiment of the present invention.
Figure 3:
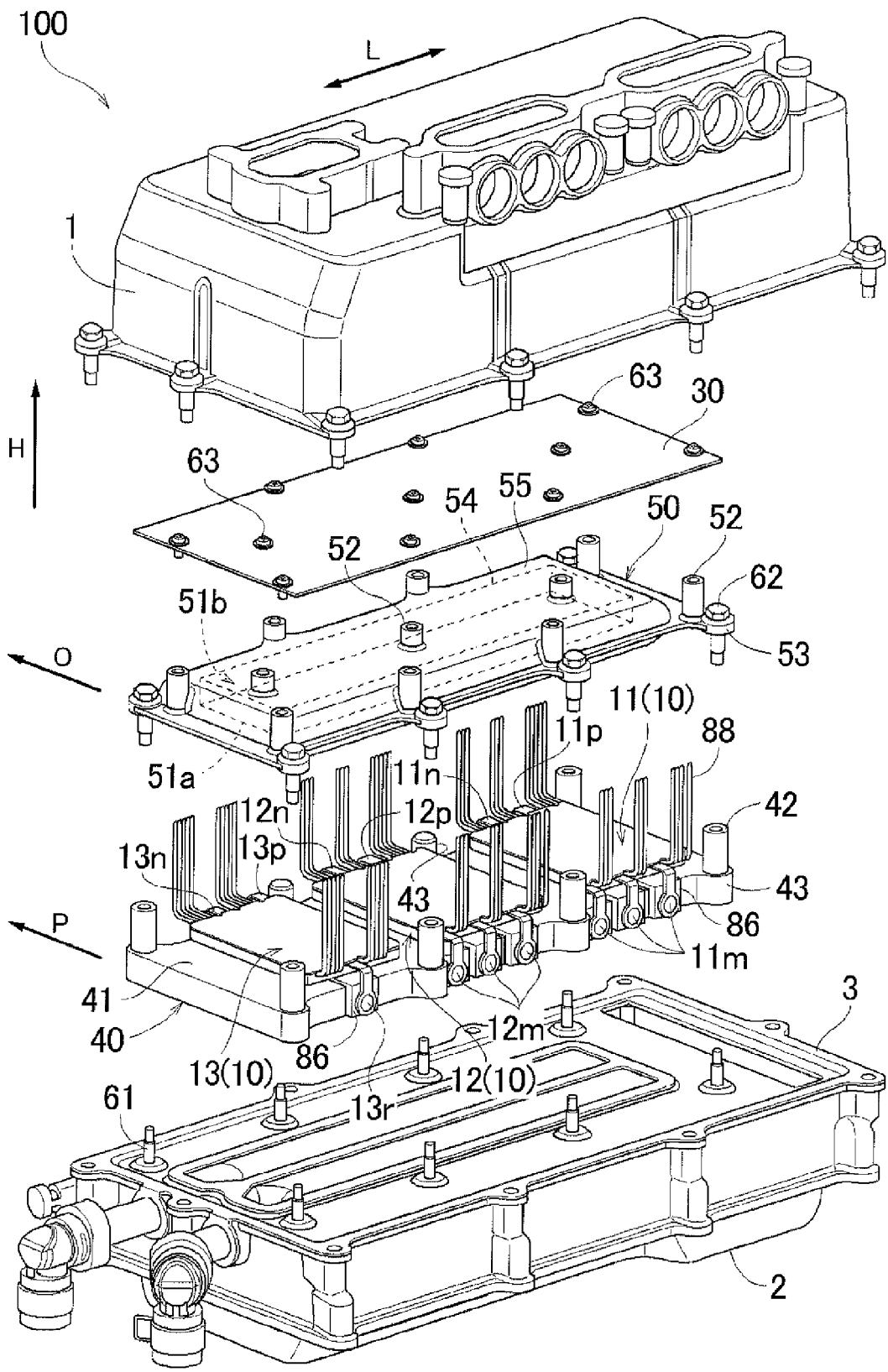
FIG. 3 is an exploded perspective view of the inverter device according to the embodiment of the present invention.

An overall configuration of the inverter device 100 will be described with reference to FIG. 1 to FIG. 4. As shown in FIG. 1 to FIG. 3, an external shape of the inverter device 100 is formed into a generally rectangular parallelepiped by a first cover member 1 attached on an upper side of the base member 3, and a second cover member 2 attached on a lower side of the base member 3. Hereinafter, a direction along the longest side of the rectangular parallelepiped will be referred to as a "longitudinal direction L". In the present embodiment, the longitudinal direction L is a direction orthogonal to the height direction H. In the present embodiment, the inverter device 100 corresponds to the "semiconductor device" in the present invention.

As shown in FIG. 1 to FIG. 3, in an upper space surrounded by the base member 3 and the first cover member 1, the cooler 40, on an upper surface of which the switching units 10 are arranged, the support bracket 50 that houses the condensers 20, and the control board 30 are arranged so as to be stacked upward in the stated order. In FIG. 3, each element provided in the control board 30 is omitted for simplification. As evident from FIG. 3, in this example, the base member 3, the cooler 40, the support bracket 50, the control board 30, and the first cover member 1 are all formed into oblong shapes when viewed in the height direction H, and arranged such that long sides thereof are in parallel with each other.

Further, as shown in FIG. 1 and FIG. 2, in a lower space surrounded by the base member 3 and the second cover member 2, a reactor 80 and a DC-DC converter 85 are arranged adjacent to each other in the longitudinal direction L. As described later in detail, the condensers 20 are electrically connected to the switching units 10. The control board 30 controls switching elements E (see FIG. 4) provided in the switching units 10.

Figure 4:
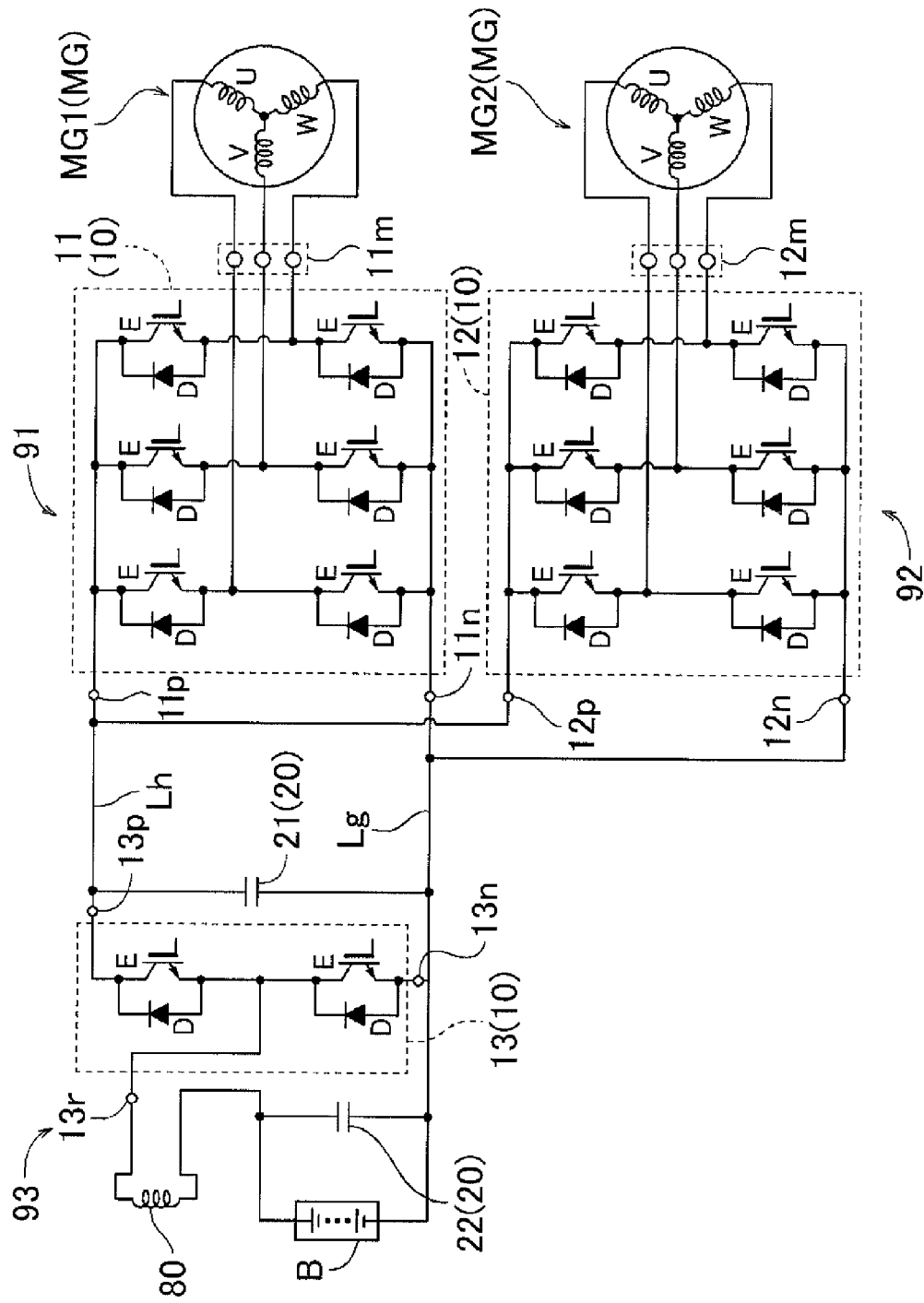
FIG. 4 is a schematic view showing a configuration of a drive circuit according to the embodiment of the present invention.

In the present embodiment, as shown in FIG. 2 and FIG. 3, the inverter device 100 includes the plurality of switching units 10. To be specific, in this example, the inverter device 100 includes three switching units 10, that is, a first switching unit 11, a second switching unit 12, and a third switching unit 13. Then, a drive circuit is formed by the three switching units 10, the condensers 20 (a first condenser 21 and a second condenser 22), and the reactor 80, for performing drive control of rotary electric machines MG by converting a direct-current voltage of a battery B into an alternating-current voltage, as shown in FIG. 4. In this example, the drive circuit is configured to perform drive control of two of the rotary electric machines MG, that is, a first rotary electric machine MG1 and a second rotary electric machine MG2. Moreover, the battery B is an example of an electric storage device, and another electric storage device such as a capacitor may be used, or a plurality of types of electric storage devices may be used in combination.

As shown in FIG. 4, the drive circuit according to the present embodiment includes a first inverter circuit 91 configured by the switching elements E provided in the first switching unit 11, a second inverter circuit 92 configured by the switching elements E provided in the second switching unit 12, and a booster circuit 93 configured by the switching elements E provided in the third switching unit 13. The first inverter circuit 91 is a circuit for performing drive control of the first rotary electric machine MG1, and the second inverter circuit 92 is a circuit for performing drive control of the second rotary electric machine MG2. The booster circuit 93 is a circuit for boosting a direct-current voltage of the battery B. A diode element D serving as a free wheel diode (FWD) is connected in parallel with each of the switching elements E that form the drive circuit.

The booster circuit 93 is formed by a pair of the switching elements E and a pair of the diode elements D provided in the third switching unit 13, and the reactor 80. The pair of switching elements E carries out an on-off operation (a switching operation) in accordance with a switching signal (a gate driving signal in this example) generated in the control board 30. Thus, a direct-current voltage boosted with respect to a direct-current voltage of the battery B is fed between a system voltage line Lh and a negative electrode line Lg, or a direct-current voltage reduced with respect to a direct-current voltage between the system voltage line Lh and the negative electrode line Lg is fed to the battery B.

Across a positive electrode terminal and a negative electrode terminal of the battery B, the second condenser 22 serving as a smoothing condenser for smoothing a direct-current voltage is placed. Also, the first condenser 21 for smoothing a direct-current voltage fed from the booster circuit 93 or from the inverter circuits 91 and 92 is placed across the system voltage line Lh and the negative electrode line Lg.

Each of the first inverter circuit 91 and the second inverter circuit 92 is configured by a bridge circuit. Specifically, each of the first inverter circuit 91 and the second inverter circuit 92 is formed by three pairs of the switching elements E and three pairs of the diode elements D. The switching elements E that form the inverter circuits 91 and 92 carry out the on-off operation in accordance with a switching signal generated in the control board 30. Thus, a direct-current voltage between the system voltage line Lh and the negative electrode line Lg is converted into an alternating-current voltage and fed to the rotary electric machines MG, or an alternating-current voltage generated by the rotary electric machines MG is converted into a direct-current voltage and fed to the battery B side. In this example, the above-described DC-DC converter 85 reduces a direct-current voltage obtained from electric generation by the rotary electric machines MG and feeding the reduced voltage to the control board 30, or to a low voltage battery (not shown) having a voltage lower than that of the battery B. In a case where the inverter device 100 is provided in a vehicle, the low voltage battery may be used as a battery for auxiliary machines for driving auxiliary machines (such as an air conditioner compressor and an oil pump).

In the present embodiment, each of the switching elements E that form the first inverter circuit 91, the second inverter circuit 92, and the booster circuit 93 is an IGBT (insulated gate bipolar transistor). However, the switching elements E are not limited to IGBTs, and other switching elements such as MOSFETs (metal oxide semiconductor field effect transistors) may be preferably used.

Also, in the present embodiment, both the first rotary electric machine MG1 and the second rotary electric machine MG2 are alternating-current electric motors that are driven on a three-phase (U phase, V phase, and W phase) alternating current, and are also able to function as motors (electric motors) that receive electricity and generate power, as well as generators (electric generators) that receive power and generate electricity. Such rotary electric machines MG are provided in an electric vehicle and a hybrid vehicle as driving force sources.

2. Configurations of the Switching Units

Next, configurations of the switching units 10 will be described. As described above, in the present embodiment, three switching units, that is, the first switching unit 11, the second switching unit 12, and the third switching unit 13 are provided as the switching units 10. Each of the switching units 10 includes the switching elements E and the diode elements D, and also includes substrates 14 on which the switching elements E and the diode elements D are arranged, and the heat sink 15, as shown in FIG. 1 and FIG. 2. In the present embodiment, the switching units 10 and the switching elements E correspond to the "element units" and the "semiconductor elements", respectively, in the present invention.

In this example, the substrates 14 are formed of a material having both electrical conductivity and thermal conductivity (such as copper and aluminum). Because the switching elements E and the diode elements D are fixed to upper surfaces of the substrates 14 by soldering, electrodes formed on lower surfaces of the switching elements E and the diode elements D are configured so as to be electrically continuous with the substrates 14. In FIG. 1 and FIG. 2, the switching elements E and the diode elements D arranged on the upper surfaces of the substrates 14 are not shown.

The substrates 14, on the upper surfaces of which the switching elements E and the diode elements D are arranged, are molded (transfer-molded) by a hard resin such as epoxy resin and urethane resin in a state where the substrates 14 are arranged on an upper surface of the heat sink 15, and the switching elements E, the diode elements D, the substrates 14, and the heat sink 15 are thus integrated (formed integrally). At least a lower surface of the heat sink 15 is exposed from the resin, and the lower surface of the heat sink 15 becomes a lower surface of the switching units 10. In this example, portions of the switching units 10 molded by the resin (resin molding portions, package portions) are formed into a rectangular shape when viewed in a direction orthogonal to the substrates 14. The direction orthogonal to the substrates 14 is parallel with the height direction H in a state where the switching units 10 are arranged on the cooler 40.

The heat sink 15 is formed of a material having thermal conductivity (such as metal and resin), and radiating fins are formed in the lower surface of the heat sink 15. As described above, because the substrates 14 are formed of an electrically conductive material in this example, when the heat sink 15 is made of an electrically conductive material, a sheet-like member having both electrical insulation and thermal conductivity is arranged between the substrates 14 and the heat sink 15.

Because the switching units 10 have the above-described configuration, heat generated by the switching elements E due to the on-off operation is transferred efficiently to the heat sink 15 through the substrates 14. Namely, the heat sink 15 is configured so that heat from the switching elements E are transferred thereto, and a surface of the switching units 10 facing the arrangement surface 41 side (a lower surface), in other words, the lower surface of the heat sink 15 serves as a heat transfer surface 15a to which heat from the switching elements E is transferred. In this example, the radiating fins are formed in the heat transfer surface 15a.

In the present embodiment, as shown in FIG. 2, the heat sink 15 is a common member for the three switching units 10, and is formed into a rectangular shape (specifically, an oblong shape) as viewed in a direction orthogonal to the substrates 14. The radiating fins are formed in the lower surfaces of portions of the heat sink 15 corresponding to the switching units 10, and the remaining portion is formed into a flat surface.

As shown in FIG. 3 and FIG. 4, each of the switching units 10 has three types of terminals. That is, the first switching unit 11 has a first positive electrode connection terminal 11p to be connected to the system voltage line Lh (that is, a positive electrode terminal of the first condenser 21, the same applies hereinafter), a first negative electrode connection terminal 11n to be connected to the negative electrode line Lg (that is, a negative electrode terminal of the second condenser 22, the same applies hereinafter), and first rotary electric machine connection terminals 11m to be connected to the first rotary electric machine MG1. The first rotary electric machine connection terminals 11m are formed of three connection terminals corresponding to the three phases (U phase, V phase, and W phase).

Similarly, the switching unit 12 has a second positive electrode connection terminal 12p to be connected to the system voltage line Lh, a second negative electrode connection terminal 12n to be connected to the negative electrode line Lg, and second rotary electric machine connection terminals 12m to be connected to the second rotary electric machine MG2. The second rotary electric connection terminals 12m are formed of three connection terminals corresponding to the three phases (U phase, V phase, and W phase). The third switching unit 13 has a third positive electrode connection terminal 13p to be connected to the system voltage line Lh, a third negative electrode connection terminal 13n to be connected to the negative electrode line Lg, and a reactor connection terminal 13r to be connected to the reactor 80.

As shown in FIG. 3, these connection terminals are formed of an electrically conductive metallic material (such as copper) extending from body portions of the switching units 10. The "body portions" herein mean portions that form cores of the switching units 10, and, in this example, refer to the resin molding portions that are formed into a rectangular shape when viewed in the direction orthogonal to the substrates 14. In the present embodiment, each of the connection terminals is formed of a flat-shaped member and also formed so as to project in a direction parallel with the arrangement surface 41 from the body portions of the switching units 10 and then bent down and extend downwardly. Then, connecting members 87 (see FIG. 1) such as bus bars formed by using an electrically conductive metallic material (such as copper) are connected to these connection terminals, thereby forming the control circuit as shown in FIG. 4.

In FIG. 1, illustrations of the connection terminals provided in the switching units 10 and the connecting members 87 connected to the condensers 20 are simplified. Terminal blocks 86 shown in FIG. 2 and FIG. 3 are used for connecting the connection terminals provided in the switching units 10 with the connecting members 87 that are connected to the positive electrodes and negative electrodes of the condensers 20 or coils of the rotary electric machines MG, and the connection terminals and the connecting members 87 are fastened and fixed at the terminal blocks 86 by fastening bolts. The connection terminals and the connecting members 87 may be configured so as to be fixed by welding. In the present embodiment, the first positive electrode connection terminal 11p, the first negative electrode connection terminal 11n, the second positive electrode connection terminal 12p, the second negative electrode connection terminal 12n, the third positive electrode connection terminal 13p, and the third negative electrode connection terminal 13n correspond to the "connection terminals" in the present invention.

As shown in FIG. 3, the first positive electrode connection terminal 11p and the first negative electrode connection terminal 11n are arranged so as to project in a predetermined projection direction P parallel with the arrangement surface 41 from the body portion of the first switching unit 11. Here, the "predetermined projection direction P" may be any direction parallel with the arrangement surface 41, and, in this example, is a direction parallel with one side of the rectangular resin molding portion when viewed in the direction orthogonal to the substrates 14 (the height direction H) as shown in FIG. 3. As described later, a condenser housing chamber 51a, which houses the condensers 20 to which the first positive electrode connection terminal 11p and the first negative electrode connection terminal 11n are connected, is formed so that an opening portion 51b thereof opens towards the projection direction P.

This allows the connection terminals 11p and 11n of the first switching unit 11, which are connected to the condensers 20, and electrode terminals of the condensers 20 projecting towards an opening direction O to project in the same direction, and it is thus possible that lengths of electric pathways between the first switching unit 11 and the condensers 20 (lengths of the first positive electrode connection terminal 11p, the first negative electrode connection terminal 11n, the connecting member 87) are reduced to be short, and that a surge voltage generated by switching of the switching elements E is reduced to be low. It is also possible to simplify shapes of the first positive electrode connection terminal 11p, the first negative electrode connection terminal 1 in, and the connecting member 87.

Similarly, the second positive electrode connection terminal 12p and the second negative electrode connection terminal 12n are arranged so as to project from the body portion of the second switching unit 12 in the projection direction P, and the third positive electrode connection terminal 13p and the third negative electrode connection terminal 13n are arranged so as to project from the body portion of the third switching unit 13 in the projection direction P, and the above-described effects are also obtained.

Meanwhile, the first rotary electric machine connection terminals 11m, the second rotary electric machine connection terminals 12m, and the reactor connection terminal 13r are arranged so as to project from the body portions of the switching units 10 in an opposite direction to the projection direction P. With details omitted, signal lines 88 for transmitting switching signals and so on with the control board 30 are connected to both end portions of the switching units 10 on the side in the projection direction P and end portions on the other direction side.

3. Configuration of the Cooler

Next, a configuration of the cooler 40 will be described. The cooler 40 has the arrangement surface 41 on which the switching units 10 are arranged, and cools the switching units 10 arranged on the arrangement surface 41. The cooler 40 is formed of a material having thermal conductivity (for example, metal including aluminum, a resin with high thermal conductivity, and so on).

In the present embodiment, the cooler 40 is configured so as to cool the switching units 10 through thermal conduction via the heat sink 15 by using a cooling liquid that is fed to the inverter device 100. In order to allow the cooling liquid fed to the inverter device 100 to circulate, upwardly-recessed base-side flow paths 71 are formed in a lower surface of the cooler 40, as shown in FIG. 1 and FIG. 2. In the present embodiment, the cooling liquid corresponds to the "coolant" in the present invention.

In the present embodiment, as shown in FIG. 1 to FIG. 3, the cooler 40 includes a body portion formed into an oblong shape when viewed in the height direction H, and a plurality of (eight in this example) attachment portions 43 provided in an outer edge portion of the body portion so as to project (protrude cylindrically) from the body portion, and the body portion and the attachment portions 43 are formed integrally.

Because first fastening bolts 61 inserted from a lower side into through holes provided in the base member 3 are fixed to fastening holes formed in the attachment portions 43, the cooler 40 is fastened and fixed to the base member 3 in the vertical direction. As shown in FIG. 1, because second sealing members 82 are arranged between the lower surface of the cooler 40 and an upper surface of the base member 3, and, the cooler 40 and the base member 3 are fastened and fixed to each other in the vertical direction by the first fastening bolts 61, the cooling liquid circulating through the base-side flow paths 71 is prevented from leaking out from the base-side flow paths 71.

At least some of the attachment portions 43 provided in the cooler 40 have bracket fixing portions 42 on the upper side, and the support bracket 50 is fixed to the bracket fixing portions 42. In the present embodiment, as shown in FIG. 3, the six attachment portions 43 out of the attachment portions 43 serve as combined portions in which the bracket fixing portions 42 are provided on the upper side of the attachment portions 43, and have a shape that projects upwardly relative to the remaining two attachment portions 43. The body portion, the attachment portions 43, and the bracket fixing portions 42 are all integrated by integral forming, fitting, and so on.

As shown in FIG. 1 and FIG. 2, the arrangement surface 41 for arranging the switching units 10 is formed on the upper surface of the body portion of the cooler 40. Here, in the present embodiment, the inverter device 100 includes the three switching units 10, and each of the switching units 10 is configured so that the heat sink 15 is exposed on the lower side. Therefore, the arrangement surface 41 provided in the cooler 40 is formed such that the switching units 10, in which the heat sink 15 is exposed on the lower side, are mounted on the arrangement surface 41.

In the present embodiment, the switching units 10 are arranged so as to contact the arrangement surface 41. As shown in FIG. 2, the arrangement surface 41 includes a planar portion that abuts from the lower side on a flat portion of the heat sink 15 where the radiating fins are not formed, and recessed portions that are located on lower sides of fin forming portions of the heat sink 15 in which the radiating fins are formed, and are recessed downwardly relative to the planar portion. In this example, the recessed portions of the arrangement surface 41 are surfaces having recesses and projections corresponding to the shape of the radiating fins.

Unit side flow paths 70, which serve as flow paths for the cooling liquid for cooling the switching unit 10, are formed between the lower surface of the heat sink 15 (that is the above-described heat transfer surface 15a) and the arrangement surface 41. Specifically, spaces defined by the heat transfer surface 15a including the surface of the radiation fins of the heat sink 15, and the arrangement surface 41 are the unit side flow paths 70. In the present embodiment, the unit side flow paths 70 correspond to the "flow paths" in the present invention.

The unit side flow paths 70 communicate with the base-side flow paths 71 through communication portions (not shown), and the cooling liquid fed to the inverter device 100 is fed to the unit side flow paths 70 through the base-side flow paths 71. This allows the cooler 40 to efficiently cool the switching units 10 arranged above the unit side flow paths 70, while reducing a temperature of itself to be low by exchanging heat with the fed cooling liquid.

As shown in FIG. 1 and FIG. 2, first sealing members 81 are arranged between the heat sink 15 and the arrangement surface 41, and the cooling liquid circulating through the unit side flow paths 70 is thus prevented from leaking out from the unit side flow paths 70 through between the arrangement surface 41 and the lower surface of the heat sink 15.

In the present embodiment, as shown in FIG. 3, the plurality of (three in this example) switching units 10 are arranged so that the projection directions P thereof are mutually the same direction, and also arranged side-by-side in a direction orthogonal to the projection direction P when viewed in the height direction H that is orthogonal to the arrangement surface 41. In accordance with such a configuration, the cooler 40 is formed so that the body portion thereof has an oblong shape, a long side of which is orthogonal to the projection direction P when viewed in the height direction H, and the cooler 40 is fixed to the base member 3 such that the long side extends along the longitudinal direction L. In short, in the present embodiment, an arrangement direction of the plurality of the switching units 10 is parallel with the longitudinal direction L 4. Configuration of the Support Bracket Next, a configuration of the support bracket 50 will be described. The support bracket 50 includes the condenser housing chamber 51a, to which the control board 30 is fixed, and, which houses the condensers 20, and board fixing portions 52 that on the opposite side of the cooler 40 from the condenser housing chamber 51a. In the present embodiment, the condensers 20 (the first condenser 21 and the second condenser 22) are formed to have two parallel planar surfaces 23 (see FIG. 1 and FIG. 2) parallel with each other, and both the first condenser 21 and the second condenser 22 are housed in the condenser housing chamber 51a. In the present embodiment, the support bracket 50 corresponds to the "support member" in the present invention.

As shown in FIG. 1 and FIG. 2, the condenser housing chamber 51a is formed inside of a chamber forming portion 51 provided in the support bracket 50. The chamber forming portion 51 is a rectangular parallelepiped member with one surface open, and is formed of an insulating material such as a resin. In the present embodiment, the chamber forming portion 51 is formed so that the inner space thereof has a uniform height, and, as shown in FIG. 1 and FIG. 2, both an upper surface wall and a lower surface wall thereof are flat surfaces that are parallel with each other. Thus, the condenser housing chamber 51a formed inside of the chamber forming portion 51 is also formed as a space having an upper surface portion and a lower surface portion that are parallel with each other. Specifically, the condenser housing chamber 51a is formed as a rectangular parallelepiped space as shown in FIG. 3, and an opening of the chamber forming portion 51 is the opening portion 51b of the condenser housing chamber 51a. In the present embodiment, only one surface of the chamber forming portion 51 is open, and the rest is closed. Therefore, in the present embodiment, the condenser housing chamber 51a is a space that is open only in the opening portion 51b, and the rest is closed. In short, in this example, the condenser housing chamber 51a is defined and formed by an upper surface wall, a lower surface wall, and side walls that cover surrounding side surfaces, except for the opening portion 51b.

Meanwhile, the board fixing portions 52 are formed in a plate-like portion 55 provided in the support bracket 50, and, in this example, the board fixing portions 52 are formed integrally with the plate-like portion 55. The plate-like portion 55 is a flat-shaped member, a center portion of which is raised relative to an outer circumferential portion. The plate-like portion 55 is arranged on an upper surface portion of the chamber forming portion 51, and is integrated with the chamber forming portion 51 by integral forming, fitting, or the like. The plate-like portion 55 is formed of a material having thermal conductivity (for example, metal such as aluminum, a resin, and so on). For instance, in a case where the chamber forming portion 51 is made of a resin and the plate-like portion 55 is made of metal (such as aluminum), it is possible to manufacture the support bracket 50 in which the chamber forming portion 51 and the plate-like portion 55 are integrated together by using an integral forming technique for metal (such as aluminum) and a resin.

In the present embodiment, the board fixing portions 52 are formed into a cylindrical shape projecting upwardly from the plate-like portion 55. The plate-like portion 55 is formed into a rectangular shape when viewed in a direction orthogonal to the upper surface portion of the chamber forming portion 51 (parallel with the height direction H in this example). As shown in FIG. 3, the board fixing portions 52 are formed in the outer circumferential portion of the plate-like portion 55, and the board fixing portions 52 are also formed on a center side of the outer circumferential portion. Because third fastening bolts 63, which are inserted from an upper side into through holes provided in the control board 30, are fixed to the board fixing portions 52, the control board 30 is fastened and fixed to the support bracket 50 in the vertical direction.

Further, attachment portions 53 for fixing the support bracket 50 to the cooler 40 are formed at six locations in an edge portion of the plate-like portion 55. The attachment portions 53 are formed at positions corresponding to the bracket fixing portions 42 formed in the cooler 40, and second fastening bolts 62, which are inserted from the upper side into through holes of the attachment portions 53, are fixed to the bracket fixing portions 42 such that the support bracket 50 is fastened and fixed to the cooler 40 in the vertical direction. It thus makes it possible for the cooler 40 to cool the condensers 20 and the control board 30 through thermal conduction via the support bracket 50.

Further, as shown in FIG. 3, the support bracket 50 is fixed to the cooler 40 in an orientation where the opening portion 51*b* of the condenser housing chamber 51*a* opens towards the projection direction P. In other words, the opening portion 51*b* provided in the condenser housing chamber 51*a* is an opening portion that is open towards the projection direction P. In this example, the opening direction O of the opening portion 51*b* is the same direction as the projection direction P, or a direction parallel with the projection direction P, to be more precise. In this example, an opening surface defined by the opening portion 51*b* is a planar surface, and a normal direction to the planar surface is the opening direction O of the opening portion 51*b*.

Here, a configuration of the condenser housing chamber 51*a* will be described in more detail. As described above, both the upper surface portion and the lower surface portion of the chamber forming portion 51, inside which the condenser housing chamber 51*a* is formed, are flat surfaces that are parallel with each other. Therefore, the condenser housing chamber 51*a* is also formed as a space having the upper surface portion and the lower surface portion that are two surfaces parallel with each other, and is formed as a rectangular parallelepiped space as a whole.

The lower surface portion of the condenser housing chamber 51*a*, in other words, a lower surface of the lower surface portion of the chamber forming portion 51 is a parallel opposing surface 51*c* that is arranged in parallel with the arrangement surface 41 and faces the arrangement surface 41 in a state where the support bracket 50 is fixed to the cooler 40. In short, the parallel opposing surface 51*c* is provided on a lower side of the condenser housing chamber 51*a*. The condenser housing chamber 51*a* houses the condensers 20 in a state where the two parallel planar surfaces 23 are arranged in parallel with the parallel opposing surface 51*c*. Therefore, a space occupied by the condenser housing chamber 51*a*, which houses the first condenser 21 and the second condenser 22 and is formed to have the two parallel planar surfaces 23 parallel with each other, is reduced to be small in the vertical direction.

In the present embodiment, as shown in FIG. 3, the condenser housing chamber 51*a* is formed into an oblong shape in a planar view in a direction orthogonal to the parallel opposing surface 51*c* (hereinafter simply referred to as a "planar view"), and is arranged so that a long side 54 thereof is orthogonal to the opening direction O in the planar view. In this example, because the opening direction O is parallel with the projection direction P, the condenser housing chamber 51*a* is arranged so that the long side 54 is orthogonal to the projection direction P. Accordingly, the parallel opposing surface 51*c* is also formed into an oblong shape and is arranged such that a long side thereof is orthogonal to the opening direction O (projection direction P) in the planar view.

Further, in the present embodiment, the plurality of (five in this example) condenser units 20*a* are housed in the condenser housing chamber 51*a*, and the first condenser 21 and the second condenser 22 are formed of the single condenser unit 20*a* or the plurality of condenser units 20*a* connected in parallel with each other. The parallel planar surfaces 23 of the above-described condensers 20 (the first condenser 21 and the second condenser 22) are formed by the two parallel planar surfaces that are provided in the condenser units 20*a* and parallel with each other.

In this example, the condenser units 20*a* are film condensers that are formed by winding or stacking a dielectric film on which a metallic film is provided by, for example, deposition, and are formed into a generally rectangular parallelepiped shape. The condenser units 20*a* are arranged so that a longest side of the rectangular parallelepiped extends along the opening direction O of the opening portion 51*b*, and the plurality of condenser units 20*a* (see FIG. 2) are arranged side-by-side along the longitudinal direction L.

The condenser units 20*a* are housed in the condenser housing chamber 51*a* together with a filled resin 60 injected through the opening portion 51*b* of the condenser housing chamber 51*a*. In other words, in the present embodiment, both the first condenser 21 and the second condenser 22 are housed in the condenser housing chamber 51*a* together with the filled resin 60. This makes it possible to fix the condensers 20 to the support bracket 50 while inhibiting deterioration of the condensers 20 due to moisture from outside. The filled resin 60 is, for example, urethane resin or epoxy resin. In the present embodiment, the condenser housing chamber 51*a* is open only in the opening portion 51*b*, and the remaining portions are closed. The opening portion 51*b* is formed in a side surface portion having a smaller area than that of a bottom surface portion in the rectangular parallelepiped condenser housing chamber 51*a*. Thus, a volume of the filled resin 60 that is required for inhibiting moisture from entering from outside can be reduced to be small, thus reducing manufacturing costs and weight to be low.

As described above, because the second fastening bolts 62 that are inserted from the upper side into the through holes of the attachment portions 53 formed in the support bracket 50 are fixed to the bracket fixing portions 42, the support bracket 50 is fastened and fixed to the cooler 40 in the vertical direction. At this time, as shown in FIG. 1 and FIG. 2, the parallel opposing surface 51*c* contacts (abuts on) upper surfaces of the switching units 10, and presses the switching units 10 toward the cooler 40. In other words, the support bracket 50 is fixed to the cooler 40 in a state where the switching units 10 are pressed by the parallel opposing surface 51*c* toward the cooler 40. This makes it possible to simplify a fixing structure for fixing the switching units 10 to the cooler 40, thereby achieving a smaller number of parts and simplification of an assembly process.

In this occasion, because the parallel opposing surface 51c that presses the switching units 10 is formed in the bottom surface portion of the chamber forming portion 51 provided in the support bracket 50, it is relatively flexible in selecting a material, and it is possible to press the switching units 10 in a portion where it is relatively easy to secure the strength. Therefore, the support bracket 50 is prevented from being deformed due to pressing of the switching units 10 toward the cooler 40, and the switching units 10 are able to be pressed toward the cooler 40 more securely.

Furthermore, in the present embodiment, each of the plurality of (three in this example) switching units 10 is arranged so as to have a portion that overlaps the parallel opposing surface 51c when viewed in the height direction H. Specifically, in the present embodiment, as shown in FIG. 1, an end portion of the parallel opposing surface 51c on the side in the projection direction P is located on the side in the projection direction P relative to end portions of the body portions of the switching units 10 (resin molding portions) on the side in the projection direction P, and an end portion of the parallel opposing surface 51c on the side in a direction opposite to the projection direction P is located on the side in the projection direction P relative to end portions of the body portions of the switching units 10 on the side in the direction to the projection direction P. In addition, as shown in FIG. 2, the parallel opposing surface 51c is arranged so as to cover most of the body portions of the three switching units 10 in the longitudinal direction L.

Hence, in the present embodiment, each of the plurality of switching units 10 is arranged so that an overall area thereof in the projection direction P and the longitudinal direction L, except for a partial region on the opposite side to the projection direction P, overlaps the parallel opposing surface 51c. This enables the single parallel opposing surface 51c to press all of the three switching units 10 toward the cooler 40.

5. Other Embodiments

Lastly, other embodiments according to the present invention will be described. Characteristics described in the respective embodiments below are not exclusively usable in the particular embodiment, and are also applicable to other embodiments as long as no inconsistency is caused.

(1) In the above embodiment, the parallel opposing surface 51c may press the switching units 10 toward the cooler 40 in the state where the parallel opposing surface 51c abuts on the upper surfaces of the switching units 10. However, embodiments of the present invention are not limited thereto and may have a configuration where another member (for example, a rubber material or the like) is arranged between the parallel opposing surface 51c and the upper surfaces of the switching units 10, and the parallel opposing surface 51c presses the switching units 10 toward the cooler 40 through the another member. In such a configuration, the another member may be made of a material with low thermal conductivity, thereby achieving heat insulation between the switching units 10 and the support bracket 50 more securely.

(2) In the above embodiment, the radiating fins may be formed in the heat transfer surface 15a that is a surface of the switching units 10 that faces the arrangement surface 41. However, the embodiments of the present invention are not limited thereto, and the radiating fins may not be provided in the heat transfer surface 15a. This configuration may be a configuration where the entire region of the heat transfer surface 15a is brought into contact with the arrangement surface 41, and the flow paths for the cooling liquid are not formed between the heat transfer surface 15a and the arrangement surface 41. Even in such a configuration, by arranging the switching units 10 such that the heat transfer surface 15a is well in contact with the arrangement surface 41, heat from the switching elements E is radiated well toward the cooler 40 through the arrangement surface 41, thereby cooling the switching elements E properly.

(3) In the above embodiment, the switching units 10 are arranged so as to be in contact with the arrangement surface 41. However, the embodiments of the present invention are not limited thereto, and may have a configuration where the switching units 10 are arranged not to be in contact with the arrangement surface 41, but to be mounted on the arrangement surface 41 through another member arranged between the switching units 10 and the arrangement surface 41.

(4) In the above embodiment, the condenser housing chamber 51a has the opening portion 51b that opens towards the projection direction P, and is open only in the opening portion 51b. However, the embodiments of the present invention are not limited thereto, and may have a configuration where the condenser housing chamber 51a includes an opening portion that opens towards a direction parallel with the arrangement surface 41 and orthogonal to the projection direction P, and is open only in the opening portion. Another configuration may also be adopted where the condenser housing chamber 51a includes an opening portion opening towards an opposite direction to the projection direction P, and is open only in the opening portion.

(5) In the above embodiment, the condenser housing chamber 51a is open only in one surface (the opening portion 51b), and the opening surface is a planar surface. However, the embodiments of the present invention are not limited thereto, and may have a configuration where the condenser housing chamber 51a is formed so as to open in a plurality of surfaces. In addition, a shape of the opening surface is not limited to a planar surface, and a configuration may be adopted where the opening surface is formed as an arc-like surface. In this case, a normal direction to a center point of the arc-like surface is the opening direction O of the opening portion. Also, such a configuration may be employed that the opening surface is formed as a combined surface in which a plurality of (for example, two or three) planar surfaces having different normal directions from each other are arranged so as to be included in the same surfaces, and, in this case, an average value of the normal directions (a sum of normal vectors) of the respective planar surfaces is the opening direction O of the opening portion.

(6) In the above embodiment, the condensers 20 are housed in the condenser housing chamber 51a together with the filled resin 60. However, the embodiments of the present invention are not limited thereto, and may have a configuration where the filled resin 60 is not provided in the condenser housing chamber 51a, and the condensers 20 are supported by fastening bolts, fitting, or the like in the condenser housing chamber 51a.

(7) In the foregoing embodiment, the inverter device 100 has the plurality of (specifically, three) switching units 10, and the plurality of switching units 10 are arranged so that the projection direction P is mutually the same direction. However, the embodiments of the present invention are not limited thereto, and a configuration may be adopted where at least some of the plurality of switching units 10 are arranged so as to have a different projection direction P from the others. In such a configuration, it is still preferred that an arrangement direction of the plurality of switching direction 10 is a direction parallel with the longitudinal direction L.

(8) In the above embodiment, the arrangement direction of the plurality of switching units 10 is a direction orthogonal to the projection direction P when viewed in the height direction H. However, the embodiments of the present invention are not limited thereto, and the plurality of switching units 10 may be arranged so that the arrangement direction of the plurality of the switching units 10 is a direction that intersects with the projection direction P at an angle less than 90 degrees when viewed in the height direction H, or a direction parallel with the projection direction P.

(9) In the above embodiment, the condenser housing chamber 51*a* is formed into an oblong shape in a planar view, and the long side 54 thereof is orthogonal to the opening direction O of the opening portion 51*b* in the planar view. However, the embodiments of the present invention are not limited thereto, and a configuration may be adopted where the long side 54 is arranged in parallel with the opening direction O in the planar view. Further, the shape of the condenser housing chamber 651*a* is not limited to the oblong shape in the planar view, and various shapes such as polygonal shapes other than quadrangle, and circular shapes (including ellipse) may be employed.

(10) In the above embodiment, the inverter device 100 has the plurality of switching units 100, and each of the plurality of switching units 100 is arranged so as to have a portion overlapping the parallel opposing surface 51*c* when viewed in the height direction H. However, the embodiments of the present invention are not limited thereto, and a configuration may be adopted where only some of the switching units 10 are arranged to have portions that overlap the parallel opposing surface 51*c* when viewed in the height direction H, and the remaining switching units 10 are moved to and arranged at positions where there are no overlaps between the remaining switching units 10 and the parallel opposing surface 51*c* when viewed in the height direction H.

(11) In the above embodiment, both the first condenser 21 and the second condenser 22 are formed so as to have the two parallel planar surfaces 23 parallel with each other, and are housed in the condenser housing chamber 51*a*. However, the embodiments of the present invention are not limited thereto, and a configuration may be adopted where only the first condenser 21 is housed in the condenser housing chamber 51*a*, and the second condenser 22 is arranged outside of the condenser housing chamber 51*a*, such as in a space below the cooler 40. In such a configuration, the first condenser 21 corresponds to the "condenser" in the present invention, and an arbitrary shape (such as a cylindrical shape that does not include the two planar surfaces parallel with each other) may be adopted as a shape of the second condenser 22.

(12) In the above embodiment, the inverter device 100 performs drive control of the two rotary electric machines MG. However, the embodiments of the present invention are not limited thereto, and may have a configuration where the number of the rotary electric machines MG drivingly controlled by the inverter device 100 is other than two (for example, one, three, or four). In addition, the present invention is applied to the inverter device 100 for performing drive control of the rotary electric machines MG. The embodiments of the present invention are not limited thereto, and the present invention is applicable to various semiconductor devices.

(13) Also regarding other configurations, the embodiments described herein are illustrative in all respects, and the present invention is not limited thereto. That is, it is a matter of course that a configuration obtained by appropriately altering part of a configuration not described in the claims of the present invention also falls within the technical scope of the present invention as long as the obtained configuration includes a configuration described in the claims or a configuration equivalent thereto.

INDUSTRIAL APPLICABILITY

The present invention is suitably applicable to a semiconductor device that includes an element unit having a semiconductor element, a condenser electrically connected to the element unit, a control board controlling the semiconductor element, and a cooler that has an element unit arrangement surface arranged such that the element unit is mounted on the element unit arrangement surface, and cools the element unit arranged on the element unit arrangement surface.

DESCRIPTION OF THE REFERENCE NUMERALS

10: switching unit (element unit)
11*p*: first positive electrode connection terminal (connection terminal)
11*n*: first negative electrode connection terminal (connection terminal)
12*p*: second positive electrode connection terminal (connection terminal)
12*n*: second negative electrode connection terminal (connection terminal)
13*p*: third positive electrode connection terminal (connection terminal)
13*n*: third negative electrode connection terminal (connection terminal)
15*a*: heat transfer surface
20: condenser
23: parallel planar surface
30: control board
40: cooler
41: arrangement surface (element unit arrangement surface)
50: support bracket (support member)
51*a*: condenser housing chamber
51*b*: opening portion
51*c*: parallel opposing surface
52: board fixing portion
54: long side
60: filled resin
70: unit-side flow path (flow path)
100: inverter device (semiconductor device)
E: switching element (semiconductor element)
O: opening direction
P: projection direction

The invention claimed is:

1. A semiconductor device including an element unit having a semiconductor element, a condenser electrically connected to the element unit, a control board that controls the semiconductor element, and a cooler that has an element unit arrangement surface arranged such that the element unit is mounted on the element unit arrangement surface, and cools the element unit arranged on the element unit arrangement surface, comprising
    a support member that has a condenser housing chamber that houses the condenser, and a board fixing portion that is across the condenser housing chamber from the cooler and has the control board fixed to the board fixing portion, wherein the condenser has two parallel planar surfaces that are parallel with each other, the condenser housing chamber has a parallel opposing surface that is arranged in parallel with the element unit arrangement surface and faces the element unit arrangement surface, and houses the condenser in a state where the two parallel planar surfaces are arranged in parallel with the parallel opposing surface, and the support member is fixed to the cooler in a state where the parallel opposing surface presses the element unit toward the cooler.

2. The semiconductor device according to claim 1, wherein a connection terminal of the element unit to be connected with the condenser is arranged so as to project from a body portion of the element unit in a predetermined projection direction parallel with the element unit arrangement surface, the condenser housing chamber has an opening portion that is open towards the projection direction, and the condenser is housed in the condenser housing chamber together with a filled resin.

3. The semiconductor device according to claim 2, comprising a plurality of the element units, wherein the condenser housing chamber is formed into an oblong shape in a planar view when viewed in a direction orthogonal to the parallel opposing surface, and is arranged so that a long side of the condenser housing chamber is orthogonal to an opening direction of the opening portion in the planar view, and each of the plurality of element units is arranged so as to have a portion that overlaps the parallel opposing surface when viewed in a direction orthogonal to the element unit arrangement surface.

4. The semiconductor device according to claim 3, wherein the plurality of element units have the same projection direction and are arranged side-by-side in a direction orthogonal to the projection direction when viewed in the direction orthogonal to the element unit arrangement surface, and the opening direction of the opening portion is a direction same as the projection direction.

5. The semiconductor device according to claim 4, wherein a surface of the element unit that faces the element unit arrangement surface is a heat transfer surface through which heat from the semiconductor element is transferred, and a flow path for a coolant that cools the element unit is formed between the heat transfer surface and the element unit arrangement surface.

6. The semiconductor device according to claim 1, wherein a surface of the element unit that faces the element unit arrangement surface is a heat transfer surface through which heat from the semiconductor element is transferred, and a flow path for a coolant that cools the element unit is formed between the heat transfer surface and the element unit arrangement surface.

7. The semiconductor device according to claim 2, wherein a surface of the element unit that faces the element unit arrangement surface is a heat transfer surface through which heat from the semiconductor element is transferred, and a flow path for a coolant that cools the element unit is formed between the heat transfer surface and the element unit arrangement surface.

8. The semiconductor device according to claim 3, wherein a surface of the element unit that faces the element unit arrangement surface is a heat transfer surface through which heat from the semiconductor element is transferred, and a flow path for a coolant that cools the element unit is formed between the heat transfer surface and the element unit arrangement surface.

* * * * *